United States Patent
Kim et al.

(10) Patent No.: US 10,559,543 B2
(45) Date of Patent: Feb. 11, 2020

(54) SEMICONDUCTOR DEVICE HAVING A PROTECTION TRENCH, SEMICONDUCTOR WAFER INCLUDING THE SAME, AND SEMICONDUCTOR PACKAGE

(71) Applicant: SAMSUNG ELECTRONICS CO., LTD, Suwon-si, Gyeonggi-Do (KR)

(72) Inventors: Sundae Kim, Hwaseong-si (KR); Yun-Rae Cho, Guri-si (KR); Namgyu Baek, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/024,309

(22) Filed: Jun. 29, 2018

(65) Prior Publication Data

US 2019/0164915 A1    May 30, 2019

(30) Foreign Application Priority Data

Nov. 29, 2017 (KR) .......................... 10-2017-0161956

(51) Int. Cl.
*H01L 23/00* (2006.01)
*H01L 23/58* (2006.01)
*H01L 23/31* (2006.01)

(52) U.S. Cl.
CPC ........ *H01L 23/585* (2013.01); *H01L 23/3171* (2013.01); *H01L 24/16* (2013.01); *H01L 24/48* (2013.01); *H01L 2224/16227* (2013.01); *H01L 2224/48227* (2013.01)

(58) Field of Classification Search
CPC ... H01L 23/585; H01L 23/3171; H01L 23/00; H01L 23/31; H01L 23/58; H01L 23/48; H01L 23/52; H01L 24/16; H01L 24/48; H01L 2224/16227; H01L 2224/8227
USPC ......................................................... 257/738
See application file for complete search history.

(56) References Cited

U.S. PATENT DOCUMENTS

| | | | |
|---|---|---|---|
| 6,424,051 B1 | 7/2002 | Shinogi et al. | |
| 6,495,918 B1 | 12/2002 | Brintzinger | |
| 7,625,779 B2 | 12/2009 | Takahashi | |
| 8,435,868 B2 | 5/2013 | Shigihara et al. | |
| 8,610,238 B2 | 12/2013 | Kaltalioglu et al. | |
| 8,742,594 B2 | 6/2014 | Daubenspeck et al. | |
| 2008/0251923 A1* | 10/2008 | Wang .................... | H01L 23/585 257/758 |

FOREIGN PATENT DOCUMENTS

| | | |
|---|---|---|
| JP | 2000-232104 | 8/2000 |
| JP | 2011-14605 | 1/2011 |
| KR | 10-2005-0067062 | 6/2005 |
| KR | 10-0870602 | 11/2008 |

* cited by examiner

*Primary Examiner* — Chuong A Luu
(74) *Attorney, Agent, or Firm* — F. Chau & Associates, LLC

(57) ABSTRACT

A semiconductor device includes a substrate including a first region and a second region at least partially surrounding the first region in a plan view. A protection pattern is disposed on the second region of the substrate and at least partially surrounds the first region of the substrate in the plan view. A protection trench overlaps the protection pattern and at least partially surrounds the first region of the substrate in the plan view, along the protection pattern. A width of the protection trench is different from a width of the protection pattern.

20 Claims, 14 Drawing Sheets

SEMICONDUCTOR DEVICE HAVING A PROTECTION TRENCH, SEMICONDUCTOR WAFER INCLUDING THE SAME, AND SEMICONDUCTOR PACKAGE

CROSS-REFERENCE TO RELATED APPLICATIONS

This U.S. nonprovisional application claims priority under 35 U.S.C. § 119 to Korean Patent Application No. 10-2017-0161956 filed on Nov. 29, 2017, in the Korean Intellectual Property Office, the entire contents of which are hereby incorporated by reference.

TECHNICAL FIELD

The present disclosure relates to a semiconductor device, and more specifically, to a semiconductor device having a protection trench, a semiconductor wafer including the same, and a semiconductor package.

DISCUSSION OF THE RELATED ART

Semiconductor devices are widely used in the electronic industry because of their small size, versatility, and relatively low fabrication cost. Semiconductor devices often include memory for storing data, processors for processing data, and hybrid devices for performing various functions simultaneously.

Semiconductor devices are becoming more highly integrated and capable of performing at faster speeds as the electronic industry advances.

SUMMARY

A semiconductor device includes a substrate including a first region and a second region at least partially surrounding the first region in a plan view. A protection pattern is disposed on the second region of the substrate and at least partially surrounds the first region of the substrate in the plan view. A protection trench overlaps the protection pattern and at least partially surrounds the first region of the substrate in the plan view, along the protection pattern. A width of the protection trench is different from a width of the protection pattern.

A semiconductor package includes a package substrate. A semiconductor device is disposed on the package substrate. A molding layer is disposed on the package substrate and covers the semiconductor device. The semiconductor device includes a substrate including a first region and a second region surrounding the first region in a plan view, a protection pattern disposed on the second region of the substrate, an insulation structure disposed on both the first and second regions of the substrate, the insulation pattern at least partially covering the protection pattern, a protection trench within a portion of the insulation structure disposed on the second region of the substrate, and a connection terminal disposed on a portion of the insulation structure on the first region of the substrate. The protection trench is disposed on the protection pattern. A width of the protection trench is different from a width of the protection pattern. The molding layer fills the protection trench.

A semiconductor wafer includes a substrate having a plurality of device regions arranged in rows along a first direction and columns along a second direction that crosses the first direction. The substrate further includes a scribe region defining each of the plurality of device regions. A protection pattern is disposed on the scribe region of the substrate. A protection trench is disposed on the scribe region of the substrate and overlaps the protection pattern. A width of the protection trench is different from a width of the protection pattern.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1:
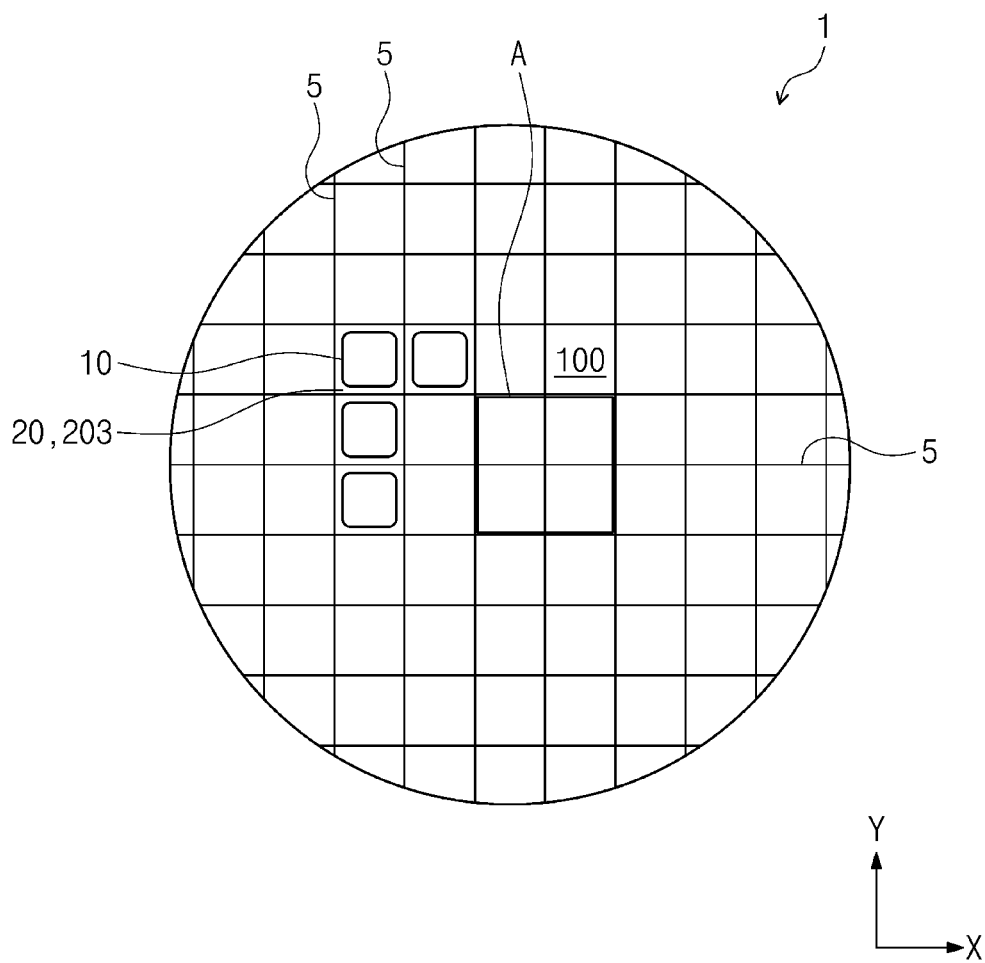
FIG. 1 is a plan view illustrating a semiconductor wafer according to exemplary embodiments of inventive concepts.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Figure 2:
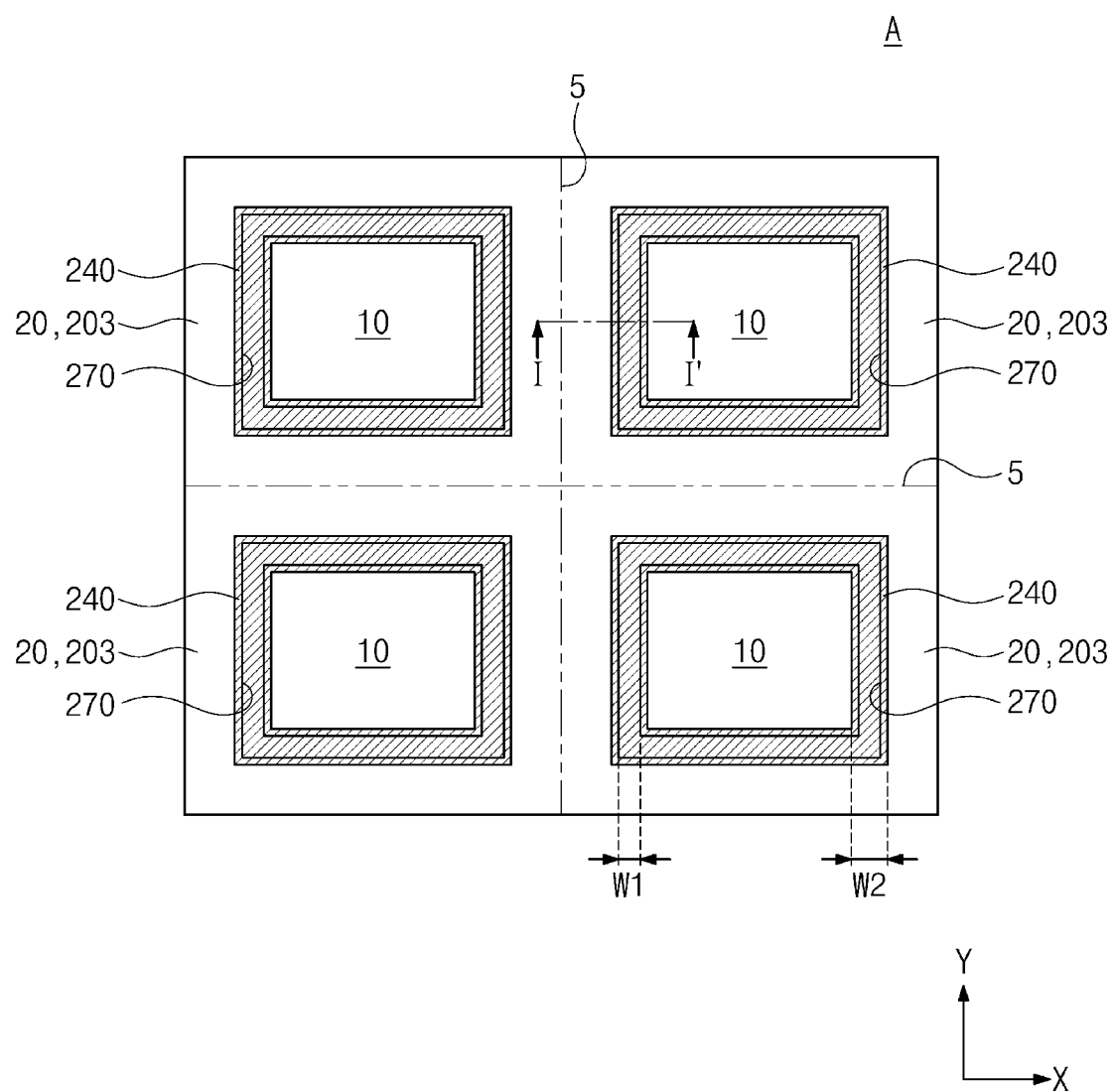
FIG. 2 is an enlarged view illustrating section A in FIG. 1, illustrating a semiconductor wafer and a semiconductor device according to exemplary embodiments of inventive concepts.
Figure 3:
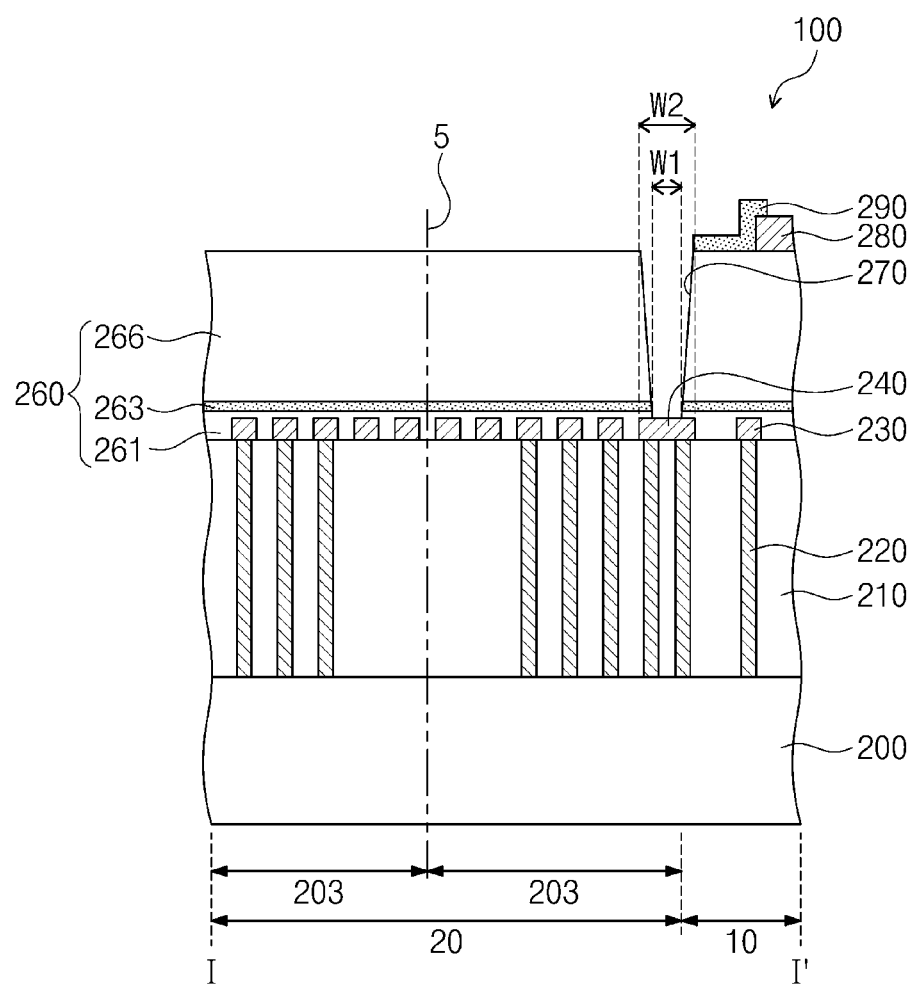
FIG. 3 is a cross-sectional view taken along line I-I' of FIG. 2, illustrating a semiconductor wafer and a semiconductor device according to exemplary embodiments of inventive concepts.

FIG. 1 is a plan view illustrating a semiconductor wafer according to exemplary embodiments of inventive concepts. FIG. 2 is an enlarged view of section A in FIG. 1, illustrating a semiconductor wafer and a semiconductor device according to exemplary embodiments of inventive concepts. FIG. 3 is a cross-sectional view taken along line I-I' of FIG. 2, illustrating a semiconductor wafer and a semiconductor device according to exemplary embodiments of inventive concepts.

Referring to FIGS. 1 to 3, a semiconductor wafer 1 may include a substrate 200, an insulation layer 210, contact plugs 220, wiring lines 230, a protection pattern 240, an insulation structure 260, a protection trench 270, a connection terminal 280, and an insulation pattern 290. The substrate 200 may include a plurality of device regions 10 and a scribe region 20 disposed around the device regions 10. The device regions 10 of the substrate 200 may be arranged in a first direction X and a second direction Y crossing each other. For example, the device regions 10 may be arranged in an array of rows and columns. Each of the device regions 10 may be configured with one or more circuits, a transistor, wiring lines, and/or a capacitor. The scribe region 20 of the substrate 200 may define the device regions 10 of the substrate 200. The scribe region 20 of the substrate 200 may separate the device regions 10 of the substrate 200 from each other.

The insulation layer 210 and the contact plugs 220 may be disposed on both the device regions 10 and the scribe region 20 of the substrate 200. The contact plugs 220 may be disposed in the insulation layer 210. The wiring lines 230 may be disposed on the insulation layer 210. The insulation layer 210, the contact plugs 220, and the wiring lines 230 will be further discussed in detail below.

The protection pattern 240 may be disposed on the insulation layer 210 disposed on the scribe region 20 of the substrate 200. The protection pattern 240 may surround each of the device regions 10 of the substrate 200. The protection pattern 240 may have a ring shape in a plan view. The protection pattern 240 may be adjacent to the device region 10. The protection pattern 240 will be further discussed in detail below.

The insulation structure 260 may be disposed on both the device regions 10 and the scribe region 20 of the substrate 200. The insulation structure 260 may at least partially cover the wiring lines 230 and the protection pattern 240. The insulation structure 260 will be further discussed in detail below.

The protection trench 270 may be disposed in the insulation structure 260 which may be disposed on the scribe region 20. The protection trench 270 may be disposed on and may vertically overlap the protection pattern 240. The protection trench 270 may extend along the protection pattern 240. For example, the protection pattern 240 may surround the device region 10 of the substrate 200. The protection pattern 240 may have a top surface exposed to the protection trench 270. The protection trench 270 may have a width W1 different from a width W2 of the protection pattern 240. For example, the width W1 of the protection trench 270 may be less than the width W2 of the protection pattern 240 (W1<W2). The protection trench 270 will be further discussed in detail below.

The connection terminal 280 and the insulation pattern 290 may be disposed on each of the device regions 10 of the substrate 200. The connection terminal 280 and the insulation pattern 290 may each be disposed on the insulation structure 260. The connection terminal 280 and the insulation pattern 290 will be further discussed in detail below.

The semiconductor wafer 1 may include a plurality of semiconductor devices 100. Each semiconductor device 100 may also be referred to as a semiconductor die or a semiconductor chip. On the scribe region 20 of the substrate 200, a wafer dicing process may be performed to cut the semiconductor wafer 1 into a plurality of individual semiconductor devices 100. For example, the wafer dicing process may use a blade to cut the semiconductor wafer 1 along a scribing line 5 of the semiconductor wafer 1.

The semiconductor device 100, separated by the wafer dicing process, may include the substrate 200, the insulation layer 210, the contact plugs 220, the wiring lines 230, the protection pattern 240, the insulation structure 260, the protection trench 270, the connection terminal 280, and the insulation pattern 290.

The substrate 200 of the semiconductor device 100 may be a portion of the semiconductor wafer 1 that is cut by the wafer dicing process. The substrate 200 may include a first region and a second region 203. The first region of the substrate 200 may correspond to the device region 10 of the semiconductor wafer 1. The reference numeral "10" may indicate not only the device region 10 of the semiconductor wafer 1 but also the first region of the substrate 200. The second region 203 of the substrate 200 may be a portion of the scribe region 20 of the semiconductor wafer 1. The second region 203 of the substrate 200 may surround the first region 10 of the substrate 200. The substrate 200 may be or may include a semiconductor substrate including silicon, germanium, or silicon-germanium, a silicon-on-insulator (SOI) substrate, or a germanium-on-insulator (GOI) substrate.

The insulation layer 210 may be disposed on the first and second regions 10 and 203 of the substrate 200. The insulation layer 210 may include a silicon oxide layer and/or a silicon nitride layer. The contact plugs 220 may be disposed on both the first and second regions 10 and 203 of the substrate 200. The contact plugs 220 may be disposed in the insulation layer 210 and may penetrate the insulation layer 210. The contact plugs 220 disposed on the first region 10 of the substrate 200 may electrically connect wiring lines in the first region 10 of the substrate 200, between a transistor and a wiring line, and/or between a capacitor and a wiring line. The contact plugs 220 disposed on the second region 203 of the substrate 200 may block or prevent a crack occurring at an edge of the semiconductor device 100 from propagating through the insulation layer 210 into the device region 10 of the substrate 200. For example, a crack may be generated from the scribing line 5 when the wafer dicing process is performed (e.g., when the insulation layer 210 is cut). The contact plugs 220 may include copper, aluminum, tungsten, titanium, titanium nitride, tantalum, and/or tantalum nitride.

The wiring lines 230 may be disposed on the insulation layer 210. The wiring lines 230 may be disposed on the first and second regions 10 and 203 of the substrate 200. The wiring lines 230 may be electrically connected to the contact plugs 220. The wiring lines 230 may include a metallic material (e.g., copper, aluminum, or tungsten).

The protection pattern 240 may be disposed on the insulation layer 210. The protection pattern 240 may be disposed on the second region 203 of the substrate 200. The protection pattern 240 may surround the first region 10 of the substrate 200. When the wafer dicing process is performed along the scribing line 5, the protection pattern 240 may block or prevent a crack generated at the scribing line 5 from propagating through the insulation structure 260 into the device region 10 of the substrate 200. The protection pattern 240 may include a metallic material (e.g., copper, aluminum, or tungsten).

The insulation structure 260 may be disposed on the first and second regions 10 and 203 of the substrate 200. The insulation structure 260 may at least partially cover the wiring lines 230 and the protection pattern 240. The insulation structure 260 may include a first insulation layer 261, a second insulation layer 263, and a third insulation layer 266 that are sequentially stacked on the insulation layer 210. The first insulation layer 261 may be or may include an inter-metal dielectric (IMD) layer or a low-k dielectric layer having a low dielectric constant. The inter-metal dielectric (IMD) layer may be or may include, for example, a silicon oxide layer or a carbon-doped silicon oxide layer. The second insulation layer 263 may serve as a buffer between the first insulation layer 261 and the third insulation layer 266. Alternatively, the second insulation layers 263 may be omitted. The second insulation layer 263 may include, for example, SiN (silicon nitride), SiON (silicon oxynitride), SiC (silicon carbide), SiCN (silicon carbon nitride), or BN (boron nitride). The third insulation layer 266 may be or may include a silicon oxide layer or a TEOS (tetraethyl orthosilicate) layer.

The protection trench 270 may be disposed on the second region 203 of the substrate 200. The protection trench 270 may be disposed in the insulation structure 260. The protection trench 270 may vertically overlap the protection pattern 240 while extending along the protection pattern 240. Accordingly, the protection trench 270 may surround the first region 10 of the substrate 200. When viewed in plan, the protection trench 270 may have a ring shape. The protection trench 270 may at least partially expose the top surface of the protection pattern 240. The protection trench 270 may have a sidewall inclined with respect to a top surface of the substrate 200, e.g. the sidewall meets the top surface of the substrate 200 at an angle that is acute or obtuse. The protection trench 270 may be filled with air. In some embodiments, the protection trench 270 may have a width W1 different from a width W2 of the protection pattern 240. For example, the width W1 of the protection trench 270 may be less than the width W2 of the protection pattern 240 (W1<W2). The protection trench 270 may have a floor surface through which the protection pattern 240 is exposed, and the width W1 of the protection trench 270 may correspond to a width of the floor surface.

According to some embodiments of inventive concepts, since the protection trench 270 is disposed on the protection pattern 240, when the wafer dicing process is performed (e.g., when the second and third insulation layers 263 and 266 are cut), a crack generated from the scribing line 5 may be prevented from propagating through the second and third insulation layers 263 and 266 into the device region 10 of the substrate 200. As the width W1 of the protection trench 270 is less the width W2 of the protection pattern 240, a crack may be prevented from propagating through the protection pattern 240 and then reaching the device region 10 of the substrate 200.

The connection terminal 280 may be disposed on the insulation structure 260. The connection terminal 280 may be disposed locally on the first region 10 of the substrate 200. The connection terminal 280 may include a conductive pad, a solder ball, a solder bump, or a conductive redistribution layer. The connection terminal 280 may include aluminum (Al), nickel (Ni), and/or copper (Cu).

The insulation pattern 290 may be disposed on the insulation structure 260. The insulation pattern 290 may be disposed locally on the first region 10 of the substrate 200, exposing a top surface of the insulation structure 260 formed on the second region 203 of the substrate 200. For example, the insulation pattern 290 may at least partially expose a top surface of the third insulation layer 266 formed on the second region 203 of the substrate 200. The insulation pattern 290 may partially expose the connection terminal 280. The insulation patterns 290 may include, for example, a silicon oxide layer or a silicon nitride layer.

Figure 4:
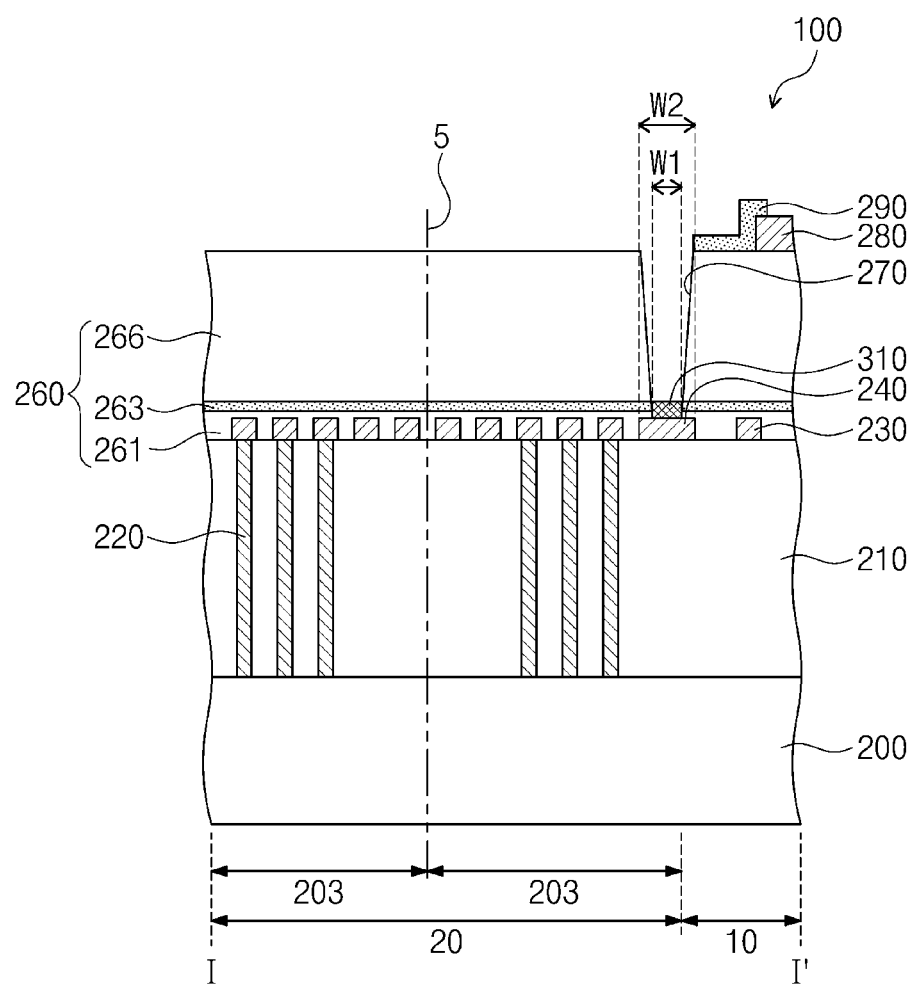
FIG. 4 is a cross-sectional view taken along line I-I' of FIG. 2, illustrating a semiconductor wafer and a semiconductor device according to exemplary embodiments of inventive concepts.

FIG. 4 illustrates a cross-sectional view taken along line I-I' of FIG. 2, showing a semiconductor wafer and a semiconductor device according to exemplary embodiments of inventive concepts. Components substantially the same as those discussed with reference to FIGS. 1 to 3 may be referred to herein by the same reference numerals, and to the extent that an explanation of one or more elements is omitted, it may be assumed that the elements are at least similar to corresponding elements that have already been described.

Referring to FIG. 4, a residue pattern 310 may be disposed in the protection trench 270. For example, when a process is performed to form the connection terminal 280, a conductive layer formed in the protection trench 270 might not be removed but may instead remain, thereby forming the residue pattern 310. For example, when a process is performed to form the insulation pattern 290, an insulation layer formed in the protection trench 270 might not be removed but may instead remain, thereby forming the residue pattern 310. Accordingly, the residue pattern 310 may include the same material as that of either the connection terminal 280 or the insulation pattern 290. For example, the residue pattern 310 may include a conductive material (e.g., aluminum, nickel, or copper) or an insulating material (e.g. a silicon oxide layer or a silicon nitride layer).

Figure 5:
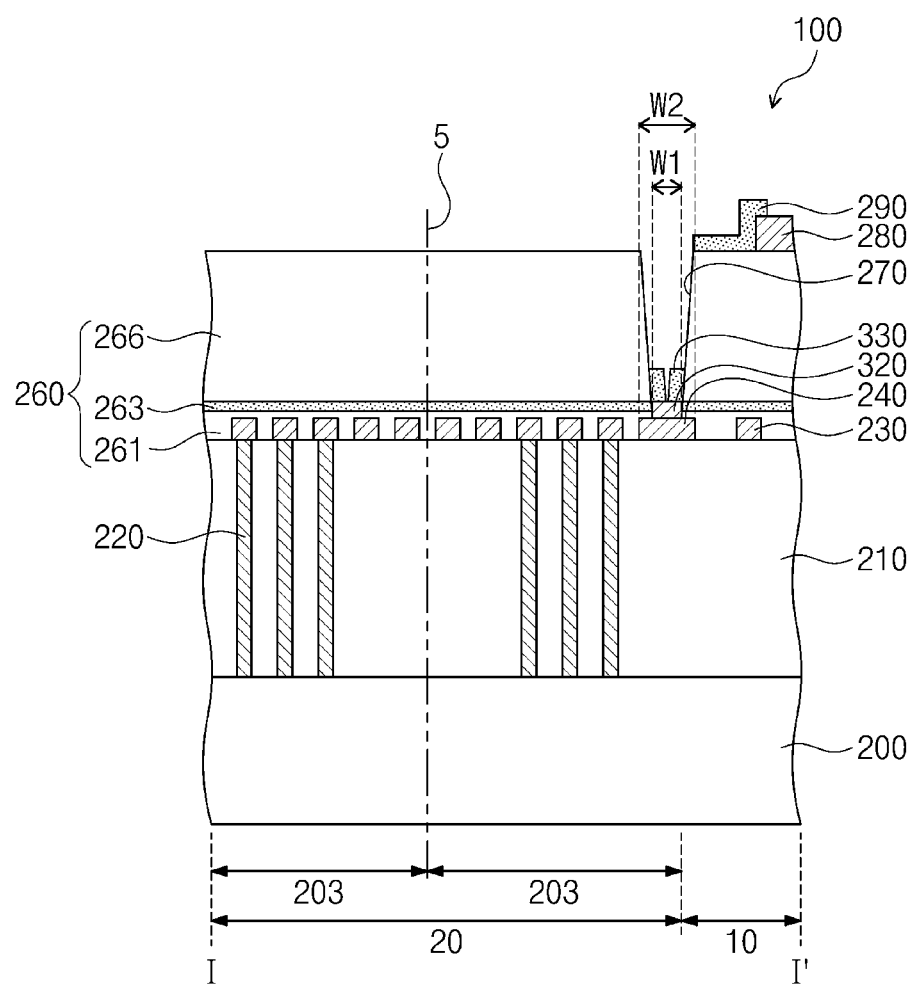
FIG. 5 is a cross-sectional view taken along line I-I' of FIG. 2, illustrating a semiconductor wafer and a semiconductor device according to exemplary embodiments of inventive concepts.

FIG. 5 is a cross-sectional view taken along line I-I' of FIG. 2, illustrating a semiconductor wafer and a semiconductor device according to exemplary embodiments of inventive concepts. Components substantially the same as those discussed with reference to FIGS. 1 to 3 may be referred to herein by the same reference numerals, and to the extent that an explanation of one or more elements is omitted, it may be assumed that the elements are at least similar to corresponding elements that have already been described.

Referring to FIG. 5, a first residue pattern 320 and a second residue pattern 330 may be disposed in the protection trench 270. The first residue pattern 320 may be disposed on the floor surface of the protection trench 270, and the second residue pattern 330 may be disposed on the first residue pattern 320. The first residue pattern 320 may include the same material as that of the connection terminal 280. The second residue pattern 330 may include the same material as that of the insulation pattern 290. The first residue pattern 320 may include aluminum (Al), nickel (Ni), and/or copper (Cu). The second residue pattern 330 may include, for example, a silicon oxide layer or a silicon nitride layer.

Figure 6:
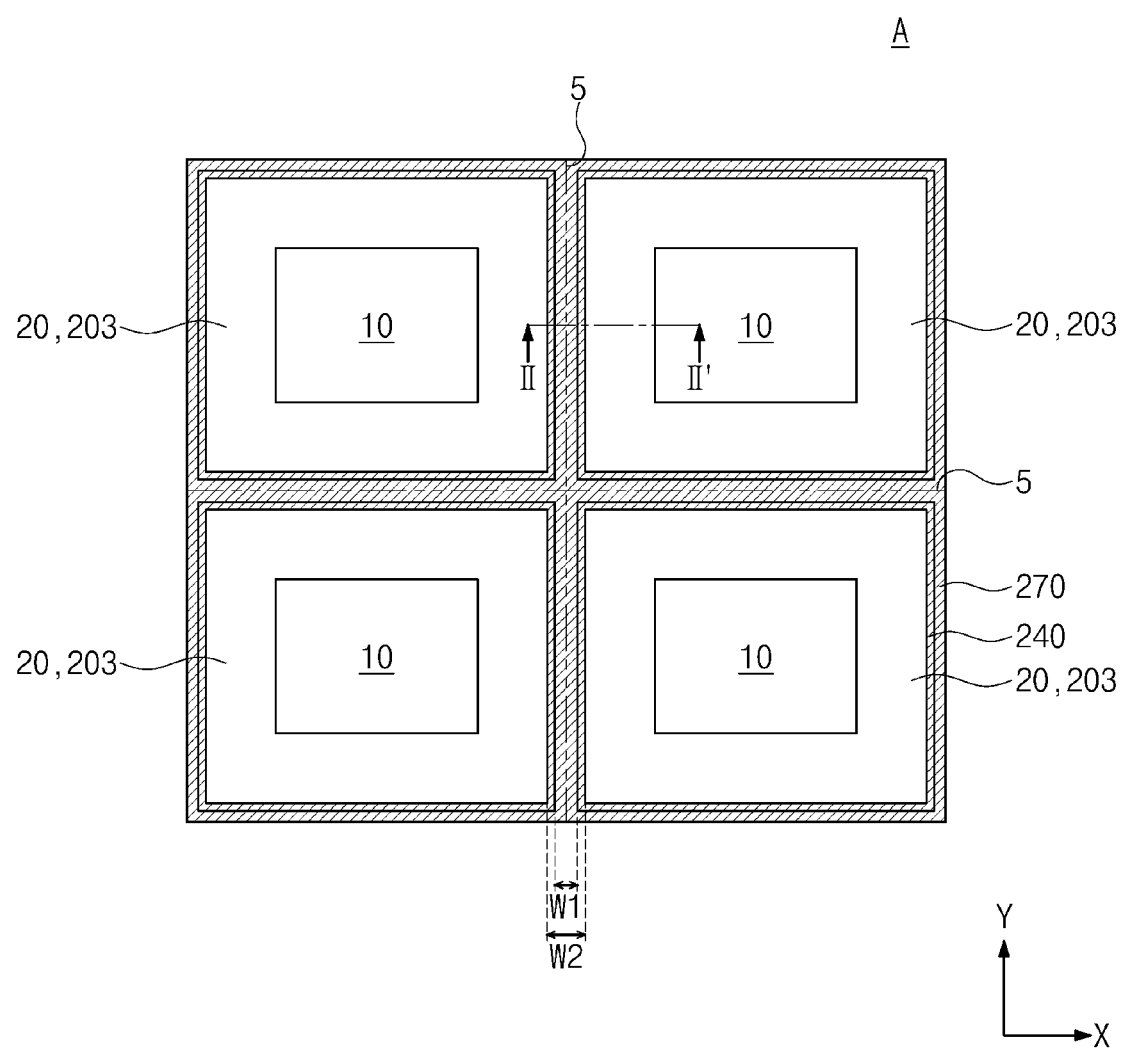
FIG. 6 is an enlarged view of section A in FIG. 1, illustrating a semiconductor wafer and a semiconductor device according to exemplary embodiments of inventive concepts.
Figure 7:
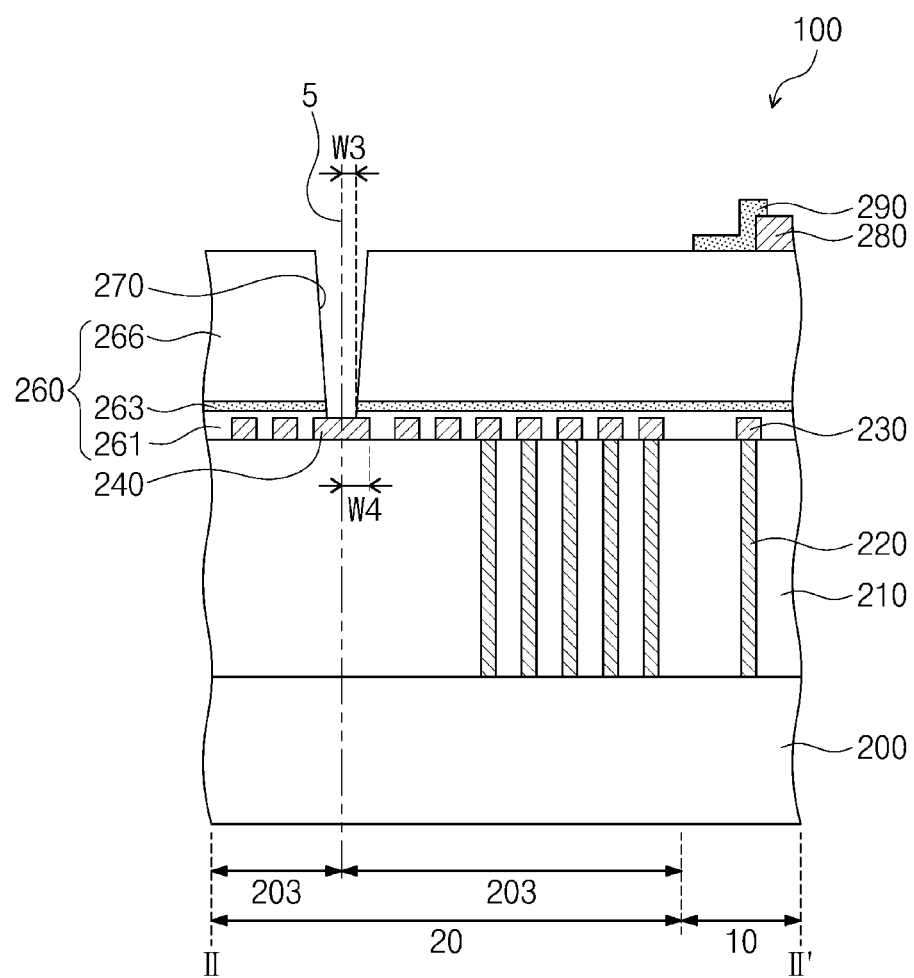
FIG. 7 is a cross-sectional view taken along line II-II' of FIG. 6, illustrating a semiconductor wafer and a semiconductor device according to exemplary embodiments of inventive concepts.

FIG. 6 is an enlarged view of section A in FIG. 1, illustrating a semiconductor wafer and a semiconductor device according to exemplary embodiments of inventive concepts. FIG. 7 is a cross-sectional view taken along line II-II' of FIG. 6, illustrating a semiconductor wafer and a semiconductor device according to exemplary embodiments of inventive concepts. Components substantially the same as those discussed with reference to FIGS. 1 to 3 may be referred to herein by the same reference numerals, and to the extent that an explanation of one or more elements is omitted, it may be assumed that the elements are at least similar to corresponding elements that have already been described.

Referring to FIGS. 6 and 7, the protection pattern 240 may be disposed on the scribe region 20 of the substrate 200. The protection pattern 240 may extend along the scribe region 20 of the substrate 200, surrounding device regions 10 of the substrate 200. The protection pattern 240 may be disposed on a central portion of the scribe region 20 of the substrate 200.

The protection trench 270 may be disposed on the scribe region 20 of the substrate 200. The protection trench 270 may be disposed on the protection pattern 240 while vertically overlapping the protection pattern 240. The protection trench 270 may extend along the protection pattern 240. For example, the protection trench 270 may extend along the scribe region 20 of the substrate 200. Accordingly, the protection trench 270 may surround the device regions 10 of the substrate 200. The width W1 of the protection trench 270 may be less than the width W2 of the protection pattern 240 (W1<W2).

For example, the semiconductor wafer 1 may be cut along the scribing line 5 extending along the protection trench 270. The width W1 of the protection trench 270 may be greater than a width of the scribing line 5, such that the protection trench 270 may prevent propagation of a crack generated from the scribing line 5. For example, the protection trench 270 and the protection pattern 240 may be cut when the wafer dicing process is performed.

The semiconductor device 100, separated by the wafer dicing process, may include the substrate 200, the insulation layer 210, the contact plugs 220, the wiring lines 230, the protection pattern 240, the insulation structure 260, the protection trench 270, the connection terminal 280, and the insulation pattern 290.

The protection pattern 240 may be disposed on the second region 203 of the substrate 200, surrounding the first region 10 of the substrate 200. The protection pattern 240 may be disposed on an edge of the second region 203 of the substrate 200. In such a configuration, the protection pattern 240 may be exposed to a lateral surface of the semiconductor device 100.

The protection trench 270 may be disposed in the insulation structure 260. The protection trench 270 may be disposed on the second region 203 of the substrate 200. The protection trench 270 may surround the first region 10 of the substrate 200. The protection trench 270 may be disposed on the protection pattern 240 while vertically overlapping the protection pattern 240. The protection trench 270 may at least partially expose the top surface of the protection pattern 240. The protection trench 270 may be disposed on an edge of the second region 203 of the substrate 200. In such a configuration, a sidewall of the protection trench 270 may form a portion of the lateral surface of the semiconductor device 100. The portion of the lateral surface of the semiconductor device 100 may be inclined with respect to the top surface of the substrate 200.

For example, the width W2 of the protection pattern 240 before the wafer dicing process may be reduced to a width W4 of the protection pattern 240 included in the semiconductor device 100 separated by the wafer dicing process. Likewise, the width W1 of the protection trench 270 before the wafer dicing process may be reduced to a width W3 of the protection trench 270 included in the semiconductor device 100 separated by the wafer dicing process (W3<W1). The width W3 of the protection trench 270 may be different from the width W4 of the protection pattern 240. For example, the width W3 of the protection trench 270 may be less than the width W4 of the protection pattern 240 (W3<W4).

Figure 8:
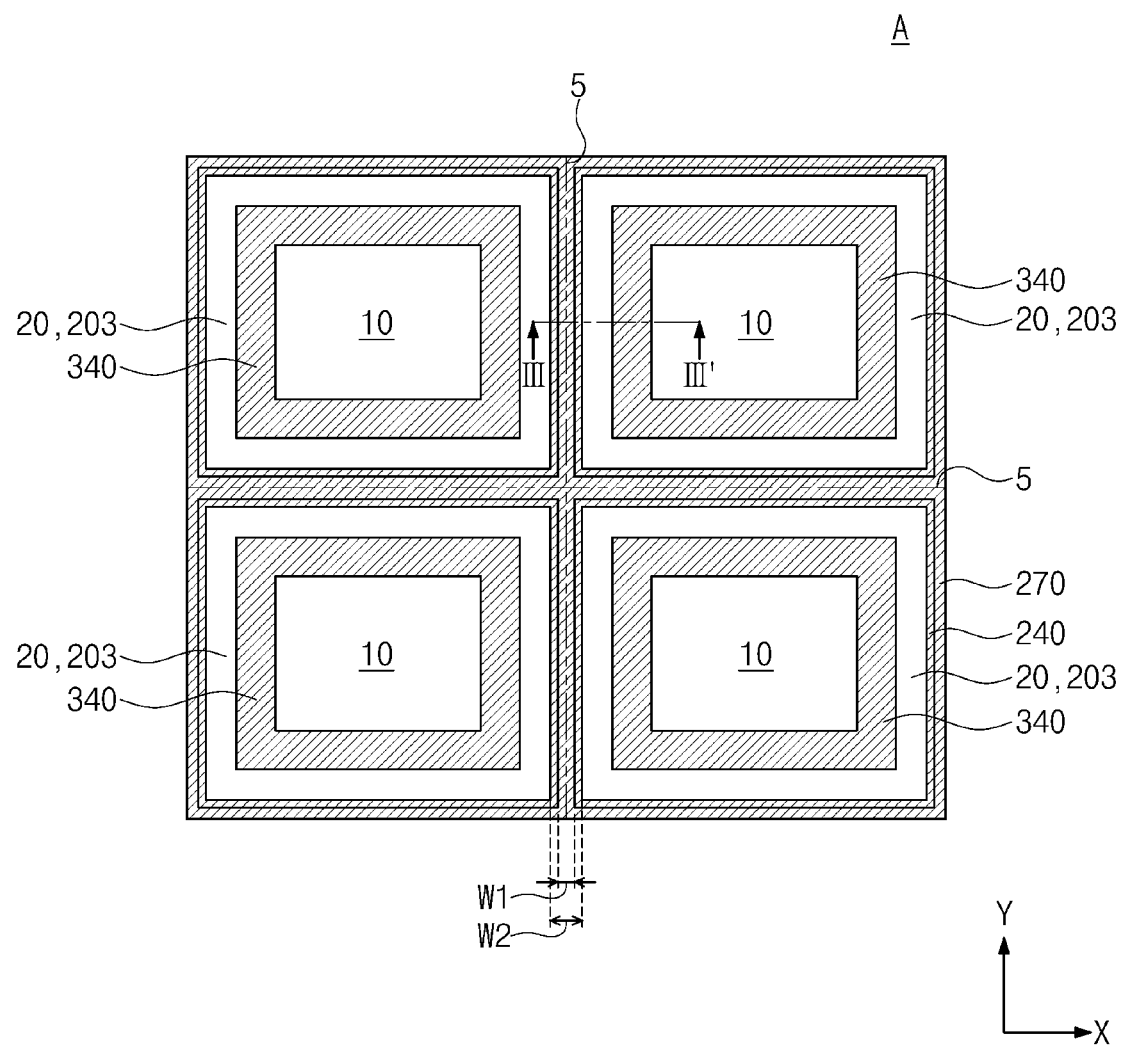
FIG. 8 is an enlarged view of section A in FIG. 1, illustrating a semiconductor wafer and a semiconductor device according to exemplary embodiments of inventive concepts.
Figure 9:
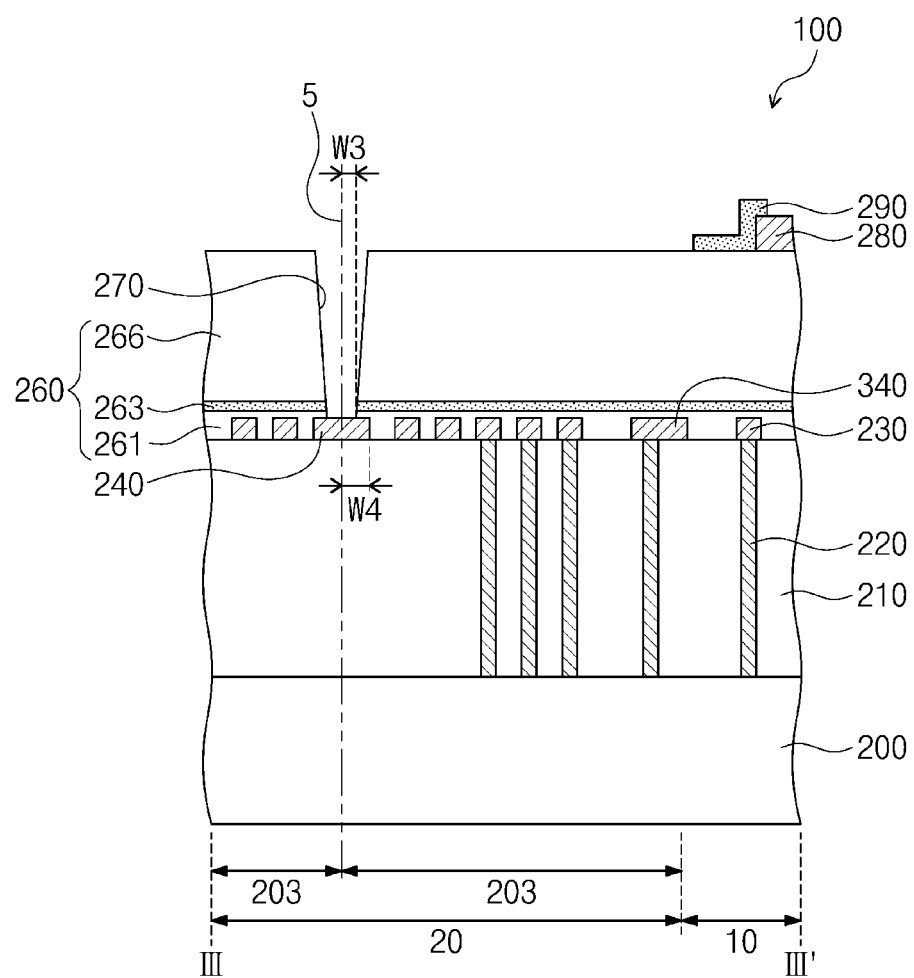
FIG. 9 is a cross-sectional view taken along line III-III' of FIG. 8, illustrating a semiconductor wafer and a semiconductor device according to exemplary embodiments of inventive concepts.

FIG. 8 is an enlarged view of section A in FIG. 1, illustrating a semiconductor wafer and a semiconductor device according to exemplary embodiments of inventive concepts. FIG. 9 is a cross-sectional view taken along line III-III' of FIG. 8, illustrating a semiconductor wafer and a semiconductor device according to exemplary embodiments of inventive concepts. Components substantially the same as those discussed with reference to FIGS. 6 and 7 may be referred to herein by the same reference numerals, and to the extent that an explanation of one or more elements is omitted, it may be assumed that the elements are at least similar to corresponding elements that have already been described.

Referring to FIGS. 8 and 9, the semiconductor wafer 1 may include a second protection pattern 340 disposed on the scribe region 20 of the substrate 200. The second protection pattern 340 may surround each of the device regions 10 of the substrate 200. The second protection pattern 340 may be spaced apart from the protection pattern 240. For example, the second protection pattern 340 may be closer to the device region 10 of the substrate 200 than the protection pattern 240 is.

The semiconductor device 100 may be configured in such a way that the second protection pattern 340 is disposed on the second region 203 of the substrate 200. The second protection pattern 340 may surround the first region 10 of the substrate 200. The second protection pattern 340 may be disposed on the insulation layer 210, and may be at least partially covered by the first insulation layer 261 of the insulation structure 260. The second protection pattern 340 may be spaced apart from the protection pattern 240. The second protection pattern 340 may be closer to the device region 10 of the substrate 200 than the protection pattern 240 is. The second protection pattern 340 may include a metallic material (e.g., copper, aluminum, or tungsten).

Figure 10:
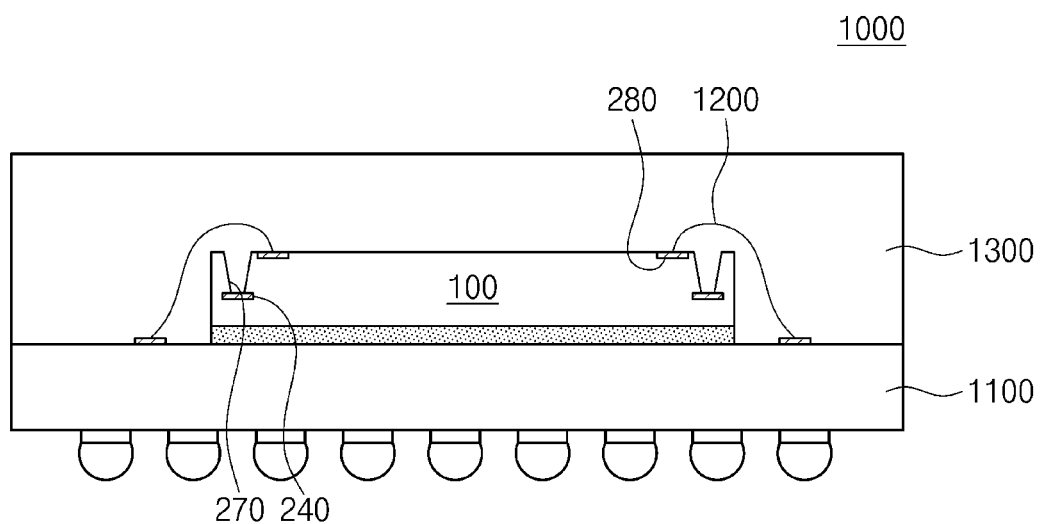
FIG. 10 is a cross-sectional view illustrating a semiconductor package including a semiconductor device according to exemplary embodiments of inventive concepts.

FIG. 10 is a cross-sectional view illustrating a semiconductor package including a semiconductor device according to exemplary embodiments of inventive concepts. Components substantially the same as those discussed with reference to FIGS. 2 to 9 may be referred to herein by the same reference numerals, and to the extent that an explanation of one or more elements is omitted, it may be assumed that the elements are at least similar to corresponding elements that have already been described.

Referring to FIG. 10, a semiconductor package 1000 may include the semiconductor device 100 discussed above. The semiconductor package 1000 may include a package substrate 1100, bonding wires 1200, and a molding layer 1300 in addition to the semiconductor device 100.

The semiconductor device 100 may be mounted on the package substrate 1100. The semiconductor device 100 may be rigidly bonded to the package substrate 1100 by an adhesive layer. The semiconductor device 100 and the package substrate 1100 may be electrically connected to each other through the bonding wires 1200. Each of the bonding wires 1200 may be connected to the connection terminal of the semiconductor device 100 discussed above. The molding layer 1300 may be disposed on the package substrate 1100. The molding layer 1300 may at least partially cover the semiconductor device 100 and the bonding wires 1200. The molding layer 1300 may be disposed in the protection trench 270 of the semiconductor device 100 discussed above. For example, the molding layer 1300 may at least partially fill the protection trench 270. The protection trench 270 may have a width different from that of the protection pattern 240 of the semiconductor device 100. For example, the width of the protection trench 270 may be less than that of the protection pattern 240 of the semiconductor device 100. Identically or similarly to that illustrated in FIGS. 6 and 7, the protection trench 270 and the protection pattern 240 may be disposed on an edge of the second region 203 of the substrate 200 included in the semiconductor device 100. For example, the protection trench 270 and the protection pattern 240 may be disposed on an edge of the semiconductor device 100.

Figure 11:
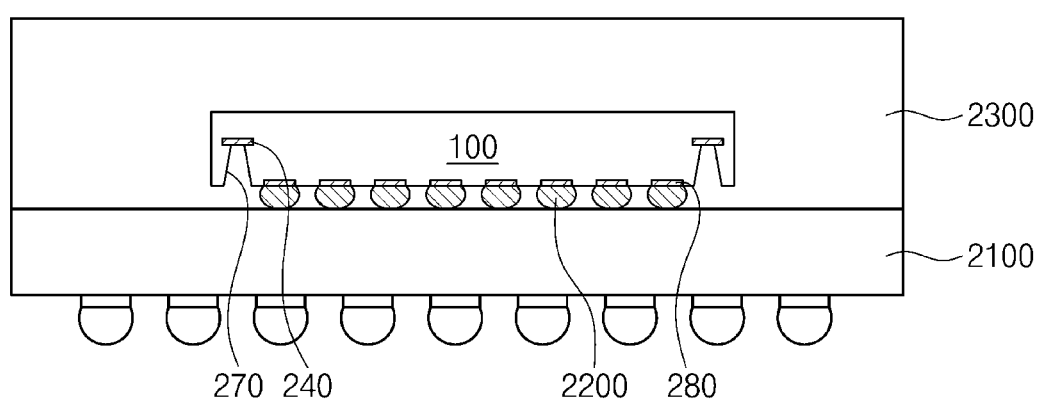
FIG. 11 is a cross-sectional view illustrating a semiconductor package including a semiconductor device according to exemplary embodiments of inventive concepts.

FIG. 11 illustrates a cross-sectional view showing a semiconductor package including a semiconductor device according to exemplary embodiments of inventive concepts. Components substantially the same as those discussed with reference to FIGS. 2 to 9 may be referred to herein by the same reference numerals, and to the extent that an explanation of one or more elements is omitted, it may be assumed that the elements are at least similar to corresponding elements that have already been described.

Referring to FIG. 11, a semiconductor package 2000 may include the semiconductor device 100 discussed above. The semiconductor package 2000 may include a package substrate 2100, solder balls 2200, and a molding layer 2300 in addition to the semiconductor device 100. The semiconductor device 100 may be mounted on the package substrate 2100. The semiconductor device 100 may be rigidly bonded to the package substrate 2100 by the solder balls 2200. Each of the solder balls 2200 may be disposed on the connection terminal 280 of the semiconductor device 100. The solder balls 2200 may be disposed between the connection terminal 280 and the package substrate 2100. The semiconductor device 100 and the package substrate 2100 may be electrically connected to each other through the solder balls 2200. The molding layer 2300 may be disposed on the package substrate 2100. The molding layer 2300 may at least partially cover the semiconductor device 100, and may at least partially fill a space between the semiconductor device 100 and the package substrate 2100. The molding layer 2300 may be disposed in the protection trench 270 of the semiconductor device 100 discussed above. For example, the molding layer 2300 may at least partially fill the protection trench 270. The protection trench 270 may have a width different from that of the protection pattern 240 of the semiconductor device 100. For example, the width of the protection trench 270 may be less than that of the protection pattern 240 of the semiconductor device 100. Identically or similarly to that illustrated in FIGS. 6 and 7, the protection trench 270 and the protection pattern 240 may be disposed on an edge of the second region 203 of the substrate 200 included in the semiconductor device 100. For example, the protection trench 270 and the protection pattern 240 may be disposed on an edge of the semiconductor device 100.

FIGS. 12A to 12D are cross-sectional views taken along line I-I' of FIG. 2, illustrating a method of fabricating a semiconductor wafer and a semiconductor device according to exemplary embodiments of inventive concepts.

Figure 12A:
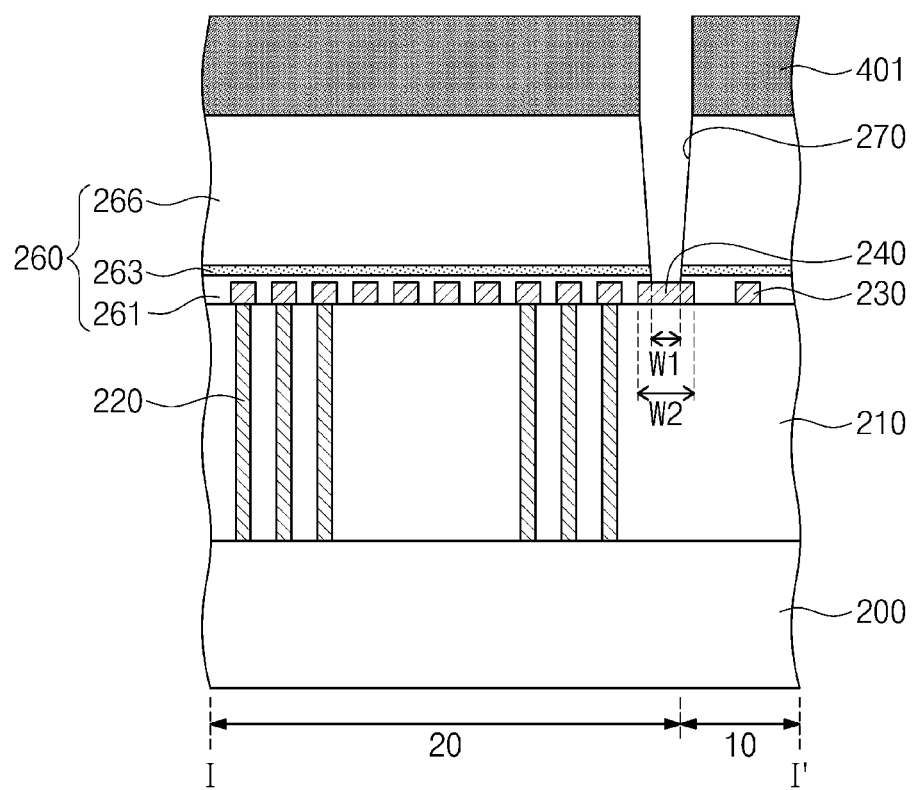
FIGS. 12A to 12D are cross-sectional views taken along line I-I' of FIG. 2, illustrating a method of fabricating a semiconductor wafer and a semiconductor device according to exemplary embodiments of inventive concepts.

Referring to FIG. 12A, an insulation layer 210 may be formed on a substrate 200. The substrate 200 may include device regions 10 arranged in a first direction X and a second direction Y crossing each other and a scribe region 20 defining the device regions 10. For example, the device regions 10 may be arranged in an array of rows and columns. The substrate 200 may be or may include a semiconductor substrate. The substrate 200 may be or may include a semiconductor substrate including silicon, germanium, or silicon-germanium, a silicon-on-insulator (SOI) substrate, or a germanium-on-insulator (GOI) substrate. The insulation layer 210 may be formed on the device regions 10 and the scribe region 20 of the substrate 200. The insulation layer 210 may include, for example, a silicon oxide layer or a silicon nitride layer.

Contact plugs 220 may be formed in the insulation layer 210. The contact plugs 220 may be formed by etching the insulation layer 210 to form contact via holes and filling the contact via holes with a conductive material. The contact plugs 220 may be formed on the device regions 10 and the scribe region 20 of the substrate 200. The contact plugs 220 may include one or more of, for example, copper, aluminum, tungsten, titanium, titanium nitride, tantalum, and tantalum nitride.

Wiring lines 230 and a protection pattern 240 may be formed on the insulation layer 210. For example, the wiring lines 230 and the protection pattern 240 may be formed by forming a metal layer on the insulation layer 210 and patterning the metal layer. Alternatively, the wiring lines 230 and the protection pattern 240 may be formed by a damascene process. The wiring lines 230 may be formed on the device regions 10 and the scribe region 20 of the substrate 200.

The protection pattern 240 may be formed on the scribe region 20 of the substrate 200. For example, the protection pattern 240 may be formed to surround each of the device regions 10 of the substrate 200. The protection pattern 240 may have a ring shape in a plan view. For example, the protection pattern 240 may be formed to extend along the scribe region 20 of the substrate 200. The wiring lines 230 and the protection pattern 240 may include, for example, a metallic material (e.g., copper, aluminum, or tungsten).

An insulation structure 260 may be formed on the insulation layer 210. The insulation structure 260 may include a first insulation layer 261, a second insulation layer 263, and a third insulation layer 266 that are sequentially stacked on the insulation layer 210. The first insulation layer 261 may at least partially cover the wiring lines 230 and the protection pattern 240. The first insulation layer 261 may be or may include an inter-metal dielectric (IMD) layer or a low-k dielectric layer having a low dielectric constant. The inter-metal dielectric (IMD) layer may be or may include, for example, a silicon oxide layer or a carbon-doped silicon oxide layer. The second insulation layer 263 may serve as a buffer between the first insulation layer 261 and the third insulation layer 266. The second insulation layers 263 may be omitted. The second insulation layer 263 may include, for example, SiN, SiON, SiCN, or BN (boron nitride). The third insulation layer 266 may be or may include a silicon oxide layer or a TEOS (tetraethyl orthosilicate) layer.

A protection trench 270 may be formed in the insulation structure 260 disposed on the scribe region 20 of the substrate 200. The protection trench 270 may be formed by forming a first etching mask pattern 401 on the insulation structure 260 and performing an etching process to etch the insulation structure 260 not covered with the first etching mask pattern 401. The etching process may be performed using dry etching or anisotropic wet etching. The first etching mask pattern 401 may include, for example, photo-sensitive polyimide. The first etching mask pattern 401 may be removed after the protection trench 270 is formed.

The protection trench 270 may be formed on the protection pattern 240 while vertically overlapping the protection pattern 240. For example, the protection trench 270 may be formed to surround each of the device regions 10 of the substrate 200. The protection trench 270 may have a ring shape in a plan view. For example, the protection trench 270 may be formed to extend along the scribe region 20 of the substrate 200. The protection trench 270 may at least partially expose a top surface of the protection pattern 240. For example, the protection pattern 240 may serve as an etch stop layer when the etching process is performed to form the protection trench 270.

The protection trench 270 may be formed to have a width W1 less than a width W2 of the protection pattern 240 (W1<W2). The third insulation layer 266 may be formed relatively thick, with respect to the other layers, such that the protection trench 270 may have a relatively high aspect ratio. The protection trench 270 may have an upper width and a lower width that is less than the upper width. The protection trench 270 may have a floor surface through which the protection pattern 240 is at least partially exposed, and the width W1 of the protection trench 270 may correspond to a width of the floor surface. The protection trench 270 may have a sidewall inclined with respect to a top surface of the substrate 200.

Figure 12B:
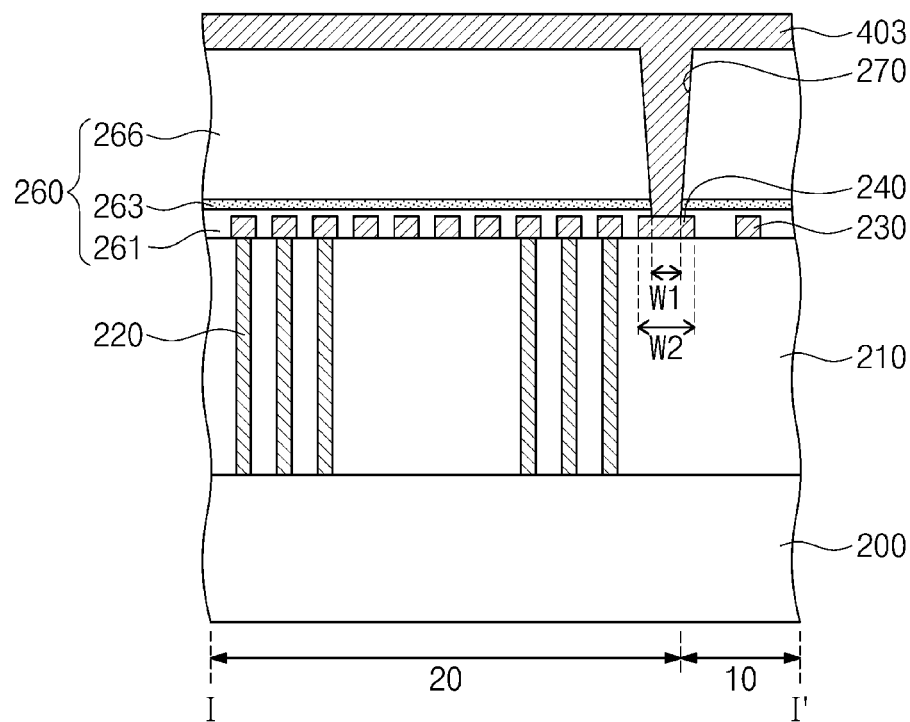

Referring to FIG. 12B, a conductive layer 403 may be formed on the insulation structure 260. For example, the conductive layer 403 may be formed to fill the protection trench 270 and to at least partially cover a top surface of the third insulation layer 266 formed on the device regions 10 and the scribe region 20 of the substrate 200. The conductive layer 403 may include aluminum (Al), nickel (Ni), and/or copper (Cu).

Figure 12C:
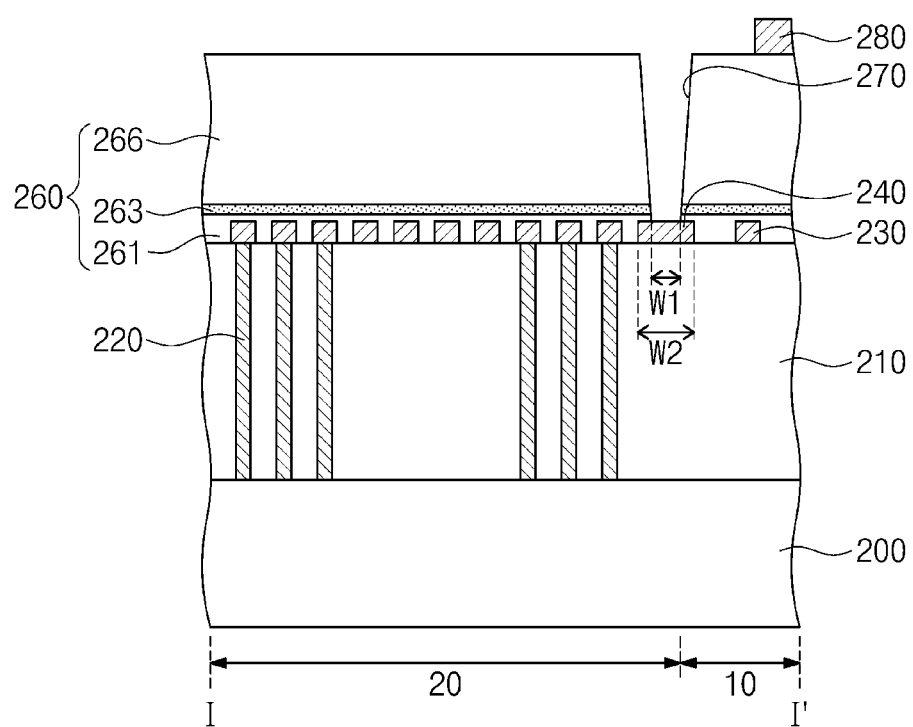

Referring to FIG. 12C, a connection terminal 280 may be formed on each of the device regions 10 of the substrate 200. The connection terminal 280 may be formed by patterning the conductive layer 403. The connection terminal 280 may be formed locally on the first region 10 of the substrate 200. The patterning process may be performed using wet etching or dry etching. The patterning process may remove the conductive layer 403 formed on the scribe region 20 of the substrate 200 and a portion of the conductive layer 403 formed on the device region 10 of the substrate 200. For example, the patterning process may at least partially expose the top surface of the third insulation layer 266 formed on the scribe region 20 of the substrate 200, sidewalls of the protection trench 270, a top surface of the protection pattern 240 exposed to the protection trench 270, and a portion of the top surface of the third insulation layer 266 formed on the device region 10 of the substrate 200.

When the patterning process is performed, the conductive layer 403 might not be completely removed from the protection trench 270. Accordingly, a portion of the conductive layer 403 may remain in the protection trench 270. The remaining portion of the conductive layer 403 may correspond either to the residue pattern 310 of FIG. 4 or to the first residue pattern 320 of FIG. 5.

Figure 12D:
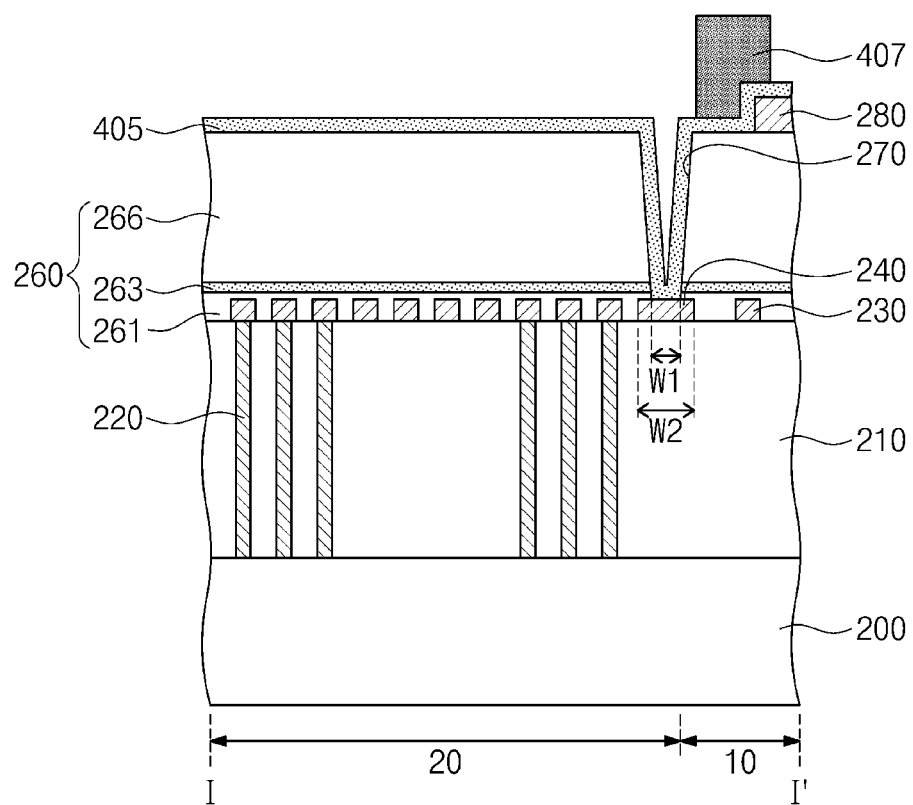

Referring to FIG. 12D, a fourth insulation layer 405 may be formed on the device regions 10 and the scribe region 20 of the substrate 200. A second etching mask pattern 407 may be formed on each of the device regions 10 of the substrate 200. The fourth insulation layer 405 may conformally cover at least a portion of the top surface of the third insulation layer 266 formed on the device regions 10 and the scribe region 20 of the substrate 200, the sidewalls of the protection trench 270, the top surface of the protection pattern 240 exposed to the protection trench 270, and top and lateral surfaces of the connection terminal 280. The second etching mask pattern 407 may at least partially expose the top surface of the third insulation layer 266 formed on the scribe region 20 of the substrate 200, the sidewalls of the protection trench 270, the top surface of the protection pattern 240, and the fourth insulation layer 405 at least partially covering the top surface of the connection terminal 280. The fourth insulation layer 405 may include, for example, a silicon oxide layer or a silicon nitride layer. The second etching mask pattern 407 may include, for example, photosensitive polyimide.

Referring back to FIG. 3, an insulation pattern 290 may be formed by performing an etching process on a portion of the fourth insulation layer 405 that is not covered with the second etching mask pattern 407. The insulation pattern 290 may be formed locally on the first region 10 of the substrate 200. The insulation pattern 290 may at least partially cover the top surface of the third insulation layer 266 formed on the device region 10 of the substrate 200 and the lateral surfaces of the connection terminal 280. The insulation pattern 290 might not cover the top surface of the third insulation layer 266 formed on the scribe region 20 of the substrate 200, the sidewalls of the protection trench 270, and the top surface of the protection pattern 240 exposed to the protection trench 270.

For example, when the etching process is performed to form the insulation pattern 290, the fourth insulation layer 405 might not be completely removed from the protection trench 270. Accordingly, a portion of the fourth insulation layer 405 may remain in the protection trench 270. The remaining portion of the fourth insulation layer 405 may correspond either to the residue pattern 310 of FIG. 4 or to the second residue pattern 330 of FIG. 5.

A wafer dicing process may be performed on the scribe region 20 of the substrate 200, and thus the insulation structure 260, the insulation layer 210, and the substrate 200 may be sequentially cut along a scribing line 5. Accordingly, a plurality of semiconductor devices 100 may be separated from each other.

According to some embodiments of inventive concepts, a scribe region of a substrate may be disposed thereon with a protection trench overlapping a protection pattern. Even when a crack is generated from a scribing line on the scribe region of the substrate when a wafer dicing process is performed to cut insulation layers in which the protection trench is formed, the protection trench may block or prevent the crack from propagating through the insulation layers into a device region of the substrate.

Although the present invention has been described in connection with the embodiments of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of the inventive concepts.

What is claimed is:

1. A semiconductor device comprising:
   a substrate including a first region and a second region at least partially surrounding the first region in a plan view;
   a protection pattern disposed on the second region of the substrate and at least partially surrounding the first region of the substrate in the plan view; and
   a protection trench overlapping the protection pattern in a cross-sectional view and at least partially surrounding the first region of the substrate in the plan view, along the protection pattern,
   wherein a width of the protection trench is different from a width of the protection pattern.

2. The semiconductor device of claim 1, wherein the width of the protection trench is less than the width of the protection pattern.

3. The semiconductor device of claim 1, wherein the protection trench exposes a top surface of the protection pattern.

4. The semiconductor device of claim 1, further comprising an insulation structure covering the protection pattern,
wherein the protection trench is disposed within the insulation structure.

5. The semiconductor device of claim 4, wherein the insulation structure comprises a first insulation layer, a second insulation layer, and a third insulation layer that are sequentially stacked on the substrate,
wherein the first insulation layer comprises an inter-metal dielectric layer or a low-k dielectric layer having a low dielectric constant,
wherein the second insulation layer comprises SiN (silicon nitride), SiON (silicon oxynitride), SiC (silicon carbide), SiCN (silicon carbon nitride), or BN (boron nitride), and
wherein the third insulation layer comprises a silicon oxide layer or a TEOS (tetraethyl orthosilicate) layer.

6. The semiconductor device of claim 1, further comprising a second protection pattern disposed on the second region of the substrate and surrounding the first region of the substrate,
wherein the second protection pattern is closer to the first region of the substrate than the protection pattern is to the first region of the substrate.

7. The semiconductor device of claim 1, wherein, when viewed in plan, the protection pattern and the protection trench are disposed on an edge of the second region of the substrate.

8. The semiconductor device of claim 1, wherein a sidewall of the protection trench is inclined with respect to the substrate.

9. A semiconductor device comprising:
a substrate including a first region and a second region at least partially surrounding the first region in a plan view;
a protection pattern disposed on the second region of the substrate and at least partially surrounding the first region of the substrate in the plan view;
a protection trench overlapping the protection pattern and at least partially surrounding the first region of the substrate in the plan view, along the protection pattern;
an insulation structure disposed on the first and second regions of the substrate and covering the protection pattern;
a connection terminal disposed on the insulation structure on the first region of the substrate; and
an insulation pattern disposed on the insulation structure on the first region of the substrate, the insulation pattern exposing a portion of the connection terminal,
wherein a width of the protection trench is different from a width of the protection pattern.

10. The semiconductor device of claim 1, wherein the protection pattern comprises a metallic material.

11. The semiconductor device of claim 1, wherein the protection trench is filled with air.

12. The semiconductor device of claim 1, further comprising a residue pattern within the protection trench, wherein the residue pattern comprises a metallic material and/or an insulating material.

13. A semiconductor package comprising:
a package substrate;
a semiconductor device disposed on the package substrate; and
a molding layer disposed on the package substrate and covering the semiconductor device,
wherein the semiconductor device comprises:
a substrate including a first region and a second region surrounding the first region in a plan view;
a protection pattern disposed on the second region of the substrate;
an insulation structure disposed on both the first and second regions of the substrate, the insulation pattern at least partially covering the protection pattern;
a protection trench within a portion of the insulation structure disposed on the second region of the substrate; and
a connection terminal disposed on a portion of the insulation structure on the first region of the substrate,
wherein the protection trench is disposed on the protection pattern,
wherein a width of the protection trench is different from a width of the protection pattern, and
wherein the molding layer fills the protection trench.

14. The semiconductor package of claim 13, wherein the width of the protection trench is less than the width of the protection pattern.

15. The semiconductor package of claim 13, wherein the protection trench exposes a top surface of the protection pattern.

16. The semiconductor package of claim 13, wherein the insulation structure comprises a first insulation layer, a second insulation layer, and a third insulation layer that are sequentially stacked on the substrate,
wherein the first insulation layer comprises an inter-metal dielectric layer or a low-k dielectric layer having a low dielectric constant,
wherein the second insulation layer comprises SiN (silicon nitride), SiON (silicon oxynitride), SiC (silicon carbide), SiCN (silicon carbon nitride), or BN (boron nitride), and
wherein the third insulation layer comprises a silicon oxide layer or a TEOS (tetraethyl orthosilicate) layer.

17. The semiconductor package of claim 13, wherein a sidewall of the protection trench is inclined with respect to the substrate of the semiconductor device.

18. The semiconductor package of claim 13, further comprising a solder ball disposed between the connection terminal and the package substrate,
wherein the solder ball electrically connects a connection terminal and the package substrate.

19. The semiconductor package of claim 13, further comprising a bonding wire disposed between the connection terminal and the package substrate,
wherein the bonding wire electrically connects a connection terminal and the package substrate.

20. The semiconductor package of claim 13, wherein the protection pattern and the protection trench are disposed on an edge of the second region of the substrate.

* * * * *